United States Patent
Smolen et al.

(10) Patent No.: US 10,269,426 B2
(45) Date of Patent: Apr. 23, 2019

(54) INTEGRATED CIRCUITS WITH COMPLEMENTARY NON-VOLATILE RESISTIVE MEMORY ELEMENTS

(71) Applicant: Intel Corporation, Santa Clara, CA (US)

(72) Inventors: Richard G. Smolen, Redwood City, CA (US); Rusli Kurniawan, Belmont, CA (US); Yue-Song He, San Jose, CA (US); Andy L. Lee, Sunnyvale, CA (US); Jeffrey T. Watt, Palo Alto, CA (US); Christopher J. Pass, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/624,413

(22) Filed: Jun. 15, 2017

(65) Prior Publication Data

US 2018/0366192 A1 Dec. 20, 2018

(51) Int. Cl.
*G11C 11/00* (2006.01)
*G11C 13/00* (2006.01)
*H03K 19/00* (2006.01)
*H03K 19/177* (2006.01)

(52) U.S. Cl.
CPC ...... *G11C 13/0069* (2013.01); *G11C 13/0011* (2013.01); *G11C 13/0023* (2013.01); *G11C 13/0038* (2013.01); *G11C 13/0097* (2013.01); *H03K 19/0002* (2013.01); *H03K 19/1776* (2013.01)

(58) Field of Classification Search
CPC .................................................. G11C 13/0011
USPC ................................................................. 365/148
See application file for complete search history.

(56) References Cited

U.S. PATENT DOCUMENTS

| | | | |
|---|---|---|---|
| 6,107,134 A * | 8/2000 | Lu | H01L 27/105 257/E21.645 |
| 7,838,863 B2 | 11/2010 | Zhao et al. | |
| 8,144,498 B2 | 3/2012 | Kumar et al. | |
| 8,437,171 B1 * | 5/2013 | Gilbert | G11C 7/04 365/148 |
| 8,625,331 B1 * | 1/2014 | Hollmer | G11C 8/08 365/148 |
| 8,981,332 B2 | 3/2015 | Chiang et al. | |
| 9,112,138 B2 | 8/2015 | Ramaswamy et al. | |
| 9,419,220 B2 | 8/2016 | Ramaswamy et al. | |
| 9,461,649 B2 | 10/2016 | Cong et al. | |

(Continued)

OTHER PUBLICATIONS

Miyamura et al., "Low-power Programmable-logic Cell Arrays using Nonvolatile Complementary Atom Switch" Low-power Electronics Association & Project (LEAP), Tsukuba, Japan, 15th International Symposium on Quality Electronic Design (ISQED), Mar. 2014, DOI: 10.1109/ISQED.2014.6783344.

*Primary Examiner* — Hoai V Ho
(74) *Attorney, Agent, or Firm* — Treyz Law Group, P.C.; Jason Tsai

(57) ABSTRACT

Integrated circuits with memory elements are provided. A memory element may include non-volatile resistive elements coupled together in a back-to-back configuration or an in-line configuration. Erase, programming, and margining operations may be performed on the resistive elements. Each of the resistive memory elements may receive a positive voltage, a ground voltage, or a negative voltage on either the anode or cathode terminal.

14 Claims, 13 Drawing Sheets

(56) References Cited

U.S. PATENT DOCUMENTS

| | | |
|---|---|---|
| 9,589,615 B2 | 3/2017 | Kulkarni et al. |
| 2006/0279328 A1* | 12/2006 | Kozicki ................ H01L 27/118 326/41 |
| 2007/0146012 A1* | 6/2007 | Murphy ................ B82Y 10/00 326/99 |

* cited by examiner

INTEGRATED CIRCUITS WITH COMPLEMENTARY NON-VOLATILE RESISTIVE MEMORY ELEMENTS

BACKGROUND

Integrated circuits such as programmable integrated circuits often contain volatile memory elements in the form of static random access memory (SRAM) cells. In programmable integrated circuits, SRAM cells may serve as configuration random access memory (CRAM) cells. Programmable integrated circuits are a type of integrated circuit that can be programmed by a user to implement a desired custom logic function. CRAM cells are used to store configuration data supplied by the user. Once loaded, CRAM cells supply control signals to transistors to configure the transistors to implement the desired logic function.

Volatile memory elements such as SRAM and CRAM cells are typically formed using a pair of cross-coupled inverters. In each memory cell, the pair of cross-coupled inverters may be connected to an address transistor that is turned on when data is being read from or written into the memory cell. When no data is being read from or written into the memory cell, the address transistor is turned off to isolate the memory cell.

There is a trend with each successive generation of integrated circuit technology to scale transistors towards smaller sizes, lower threshold voltages, and lower power supply voltages. Lower power supply voltages and smaller devices may lead to decreased read/write margins for volatile memory elements. This can pose challenges for reliable device operation.

Moreover, smaller devices tend to suffer more from process, voltage, and temperature variations (PVT variations). Operating the memory elements at lower power supply voltages can further exacerbate the amount of variation experienced by the memory elements, resulting in reduced memory yield.

It is within this context that the embodiments described herein arise.

DETAILED DESCRIPTION

The present embodiments relate to integrated circuits that include arrays of memory elements. Memory element arrays can be used to store data during data processing operations. In programmable integrated circuits such as programmable logic devices, arrays of memory elements may be loaded with configuration data that is used in configuring programmable logic circuitry. Memory elements that are used in storing configuration data for programmable integrated circuits are sometimes referred to as configuration random-access memory (CRAM) cells. Memory cells used in other types of random-access memory (RAM) arrays are sometimes referred to as RAM cells.

Memory cells can be used in any suitable integrated circuit that uses memory. Such types of integrated circuits may include memory chips, digital signal processing circuits with memory arrays, microprocessors, application specific integrated circuits with memory arrays, programmable integrated circuits such as programmable logic device integrated circuits in which memory cells are used for configuration memory, or any other suitable integrated circuit.

Figure 1:
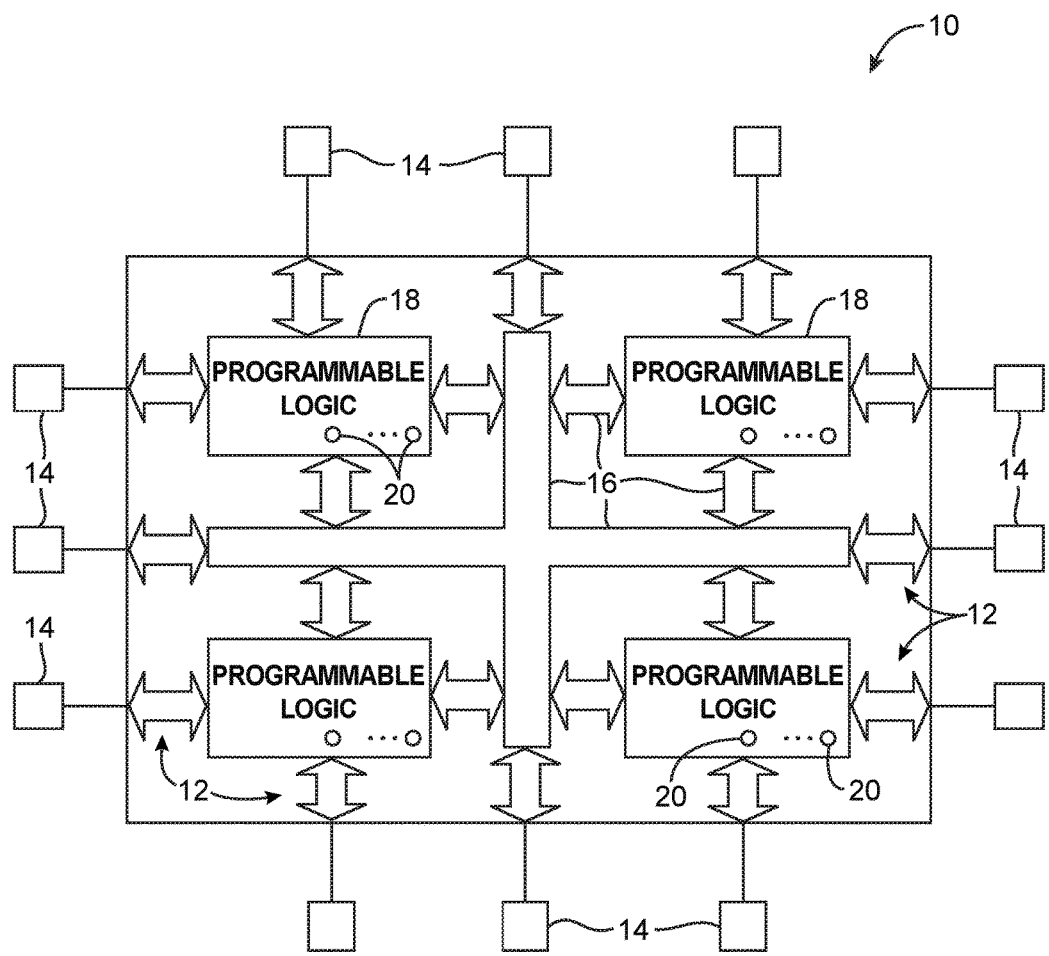
FIG. 1 is a diagram of an illustrative programmable integrated circuit in accordance with an embodiment.

An illustrative integrated circuit 10 comprising memory is shown in FIG. 1. Device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Device 10 contains volatile memory cells 20 that can be loaded with configuration data (also called programming data) using pins 14 and input-output circuitry 12. Once loaded, the memory cells can provide corresponding static control output signals that control the state of an associated logic component in programmable logic 18. If desired, memory cells 20 may be used in SRAM-type memory arrays (e.g., to store data for processing circuitry during operation of device 10).

Memory cell 20 may be formed from a number of transistors configured to form a bistable circuit. The memory cells may be loaded from an external erasable-programmable read-only memory and control chip or other suitable data source via pins 14 and input-output circuitry 12. Loaded CRAM memory cells 20 may provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc.

The memory cells 20 may be arranged in an array pattern. In a typical modern programmable logic device, there may be millions of memory cells 20 on chip 10. During programming operations, the array of memory cells is provided with configuration data by a user (e.g., a logic designer). Once loaded with configuration data, the memory cells 20 selectively control portions of the circuitry in the programmable logic 18 and thereby customize its functions so that it will operate as desired.

The circuitry of device 10 may be organized using any suitable architecture. As an example, the logic of device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

When memory cells 20 are arranged in an array, horizontal and vertical conductors and associated control circuitry may be used to access the memory cells. The control circuitry may, for example, be used to clear all or some of the memory cells. The control circuitry may also write data into the memory cells and may read data from the memory cells. For example, in CRAM arrays, the memory cells may be loaded with configuration data. Loaded configuration data may then be read out from the array to confirm proper data loading operations before device 10 is used during normal operation in a system.

Figure 2:
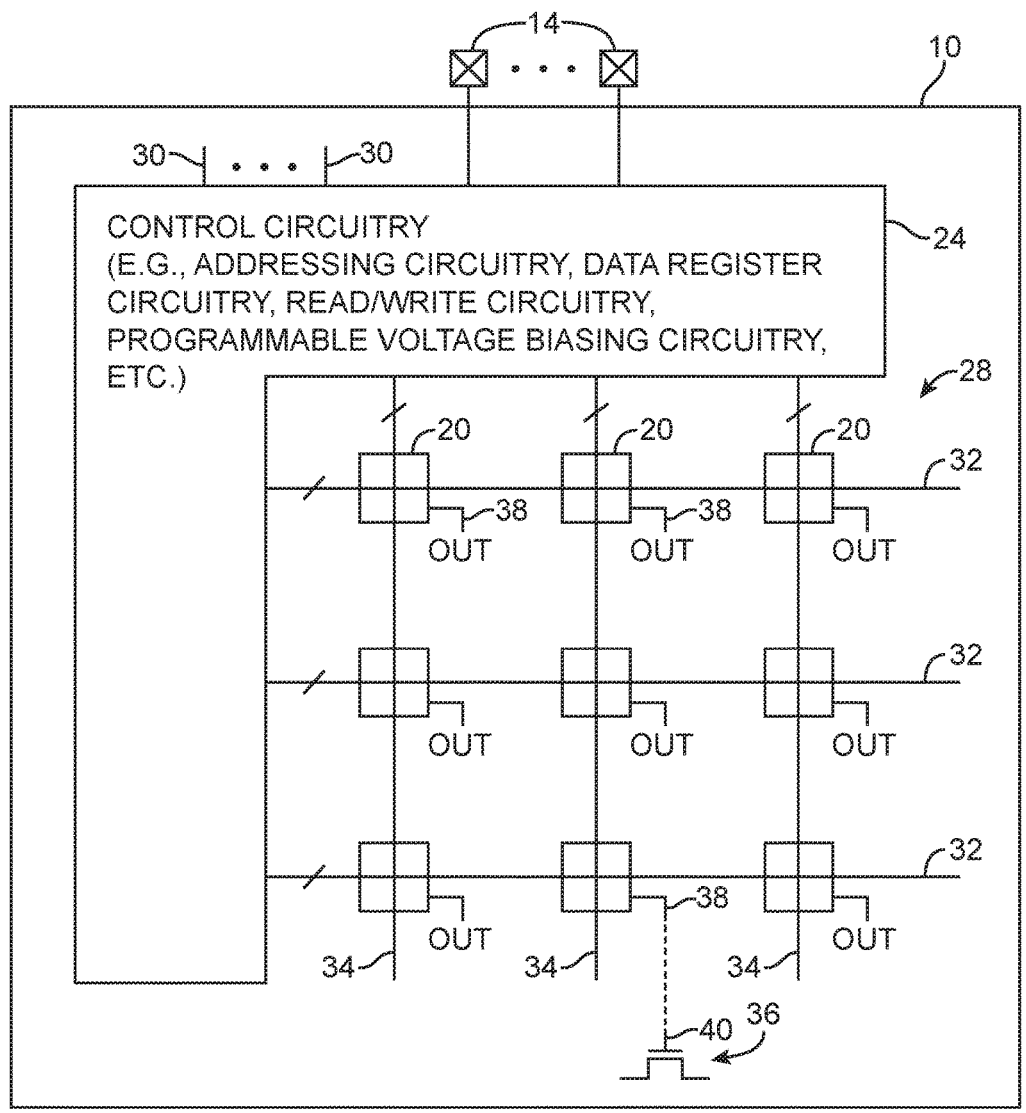
FIG. 2 is a diagram of an illustrative memory array in accordance with an embodiment.

As described above, any suitable memory array architecture may be used for arranging memory cells 20. One suitable arrangement is shown in FIG. 2. There are only three rows and columns of memory cells 20 in the illustrative array of FIG. 2, but in general there may be hundreds or thousands of rows and columns in memory array 28. Array 28 may be one of a number of arrays on device 10, may be a subarray that is part of a larger array, or may be any other suitable group of memory cells 20.

Each memory cell 20 may supply a corresponding output signal OUT at a corresponding output path 38. In CRAM arrays, each signal OUT is a static output control signal that may be conveyed over a corresponding path 40 and may be used in configuring an associated transistor such as transistor 36 (e.g., a pass transistor) or other suitable circuit elements in an associated programmable logic circuit.

Integrated circuit 10 may have control circuitry 24 for supplying signals to memory array 28. Control circuitry 24 may receive power supply voltages, data, and other signals from external sources using pins 14 and from internal sources using paths such as paths 30. Control circuitry 24 may include circuitry such as addressing circuitry, data register circuitry, read/write circuitry, etc. Control circuitry 24 may use the power supply voltages supplied through pins 14 to produce desired time-varying and fixed signals on paths 32 and 34.

There may, in general, be any suitable number of conductive lines associated with paths 32 and 34. For example, each row of array 28 may have a respective path 32 that includes an associated address line (e.g., a word line) and/or associated read/write enable lines (as examples). Each column of array 28 may have a respective path 34 that includes one or more data lines.

In general, power can be distributed in a global fashion. For example, a positive power supply voltage Vcc may be supplied in parallel to each cell 20 using a pattern of shared horizontal or vertical conductors. A ground voltage Vss may likewise be supplied in parallel to cells 20 using a pattern of shared horizontal or vertical lines. Control lines such as address lines and data lines are typically orthogonal to each other (e.g., address lines are horizontal, whereas data lines are vertical or vice versa).

Positive power supply voltage Vcc may be provided over a positive power supply line, whereas ground voltage Vss may be provided over a ground power supply line. Any suitable value may be used for positive power supply voltage Vcc and ground voltage Vss. For example, positive power supply voltage Vcc may be 2V, 1.2 V, 1.1 V, 1.0 V, 0.9 V, less than 0.9 V, or any other suitable voltage. Ground voltage Vss may be zero volts or 0.1 V (as examples). In a typical arrangement, power supply voltage Vcc may be 0.85 V, Vss may be zero volts, and the signal levels for address, data, and clear signals may range from zero volts or −2 V (when low) to +2 V (when high). Arrangements in which Vcc varies as a function of time, in which Vss is less than zero volts, and in which control signals are overdriven (i.e., in which control signals have signal strengths larger than Vcc−Vss) may also be used, if desired.

The terms "rows" and "columns" merely represent one way of referring to particular groups of cells 20 in memory array 28 and may sometimes be used interchangeably. If desired, other patterns of lines may be used in paths 32 and 34. For example, different numbers of power supply signals, data signals, and address signals may be used.

Conventionally, configuration memory elements are implemented using volatile memory elements (e.g., SRAM memory cells). A volatile memory element retains data only so long as the integrated circuit is powered. In the event of power loss, the data in the volatile memory element is lost. Volatile memory elements are subject to a phenomenon known as single event upset. Single event upset events are caused by cosmic rays and radioactive impurities embedded in integrated circuits and their packages. Cosmic rays and radioactive impurities generate high-energy atomic particles such as neutrons and alpha particles. The memory elements contain transistors and other components that are formed from a patterned silicon substrate. When an atomic particle strikes the silicon in the memory element, electron-hole pairs are generated. The electron-hole pairs create a conduction path that can cause a charged node in the memory element to discharge and the state of the memory element to flip. If, for example, a "1" was stored in the memory element, a single event upset (SEU) could cause the "1" to change to a "0."

Upset events in an integrated circuit corrupt the data stored in the memory elements and can have serious repercussions for system performance. In certain system applications such as remote installations of telecommunications equipment, it is extremely burdensome to repair faulty equipment. Unless integrated circuits demonstrate good immunity to single event upset, they will be unsuitable for these types of applications.

Figure 3A:
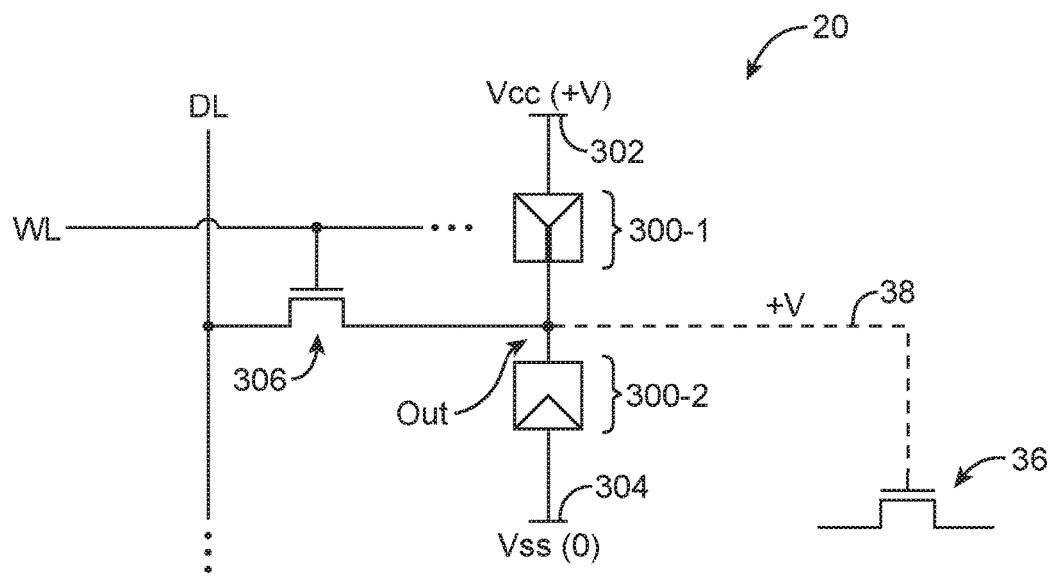
FIGS. 3A and 3B are diagrams of an illustrative back-to-back non-volatile resistive memory element in accordance with an embodiment.
Figure 3B:
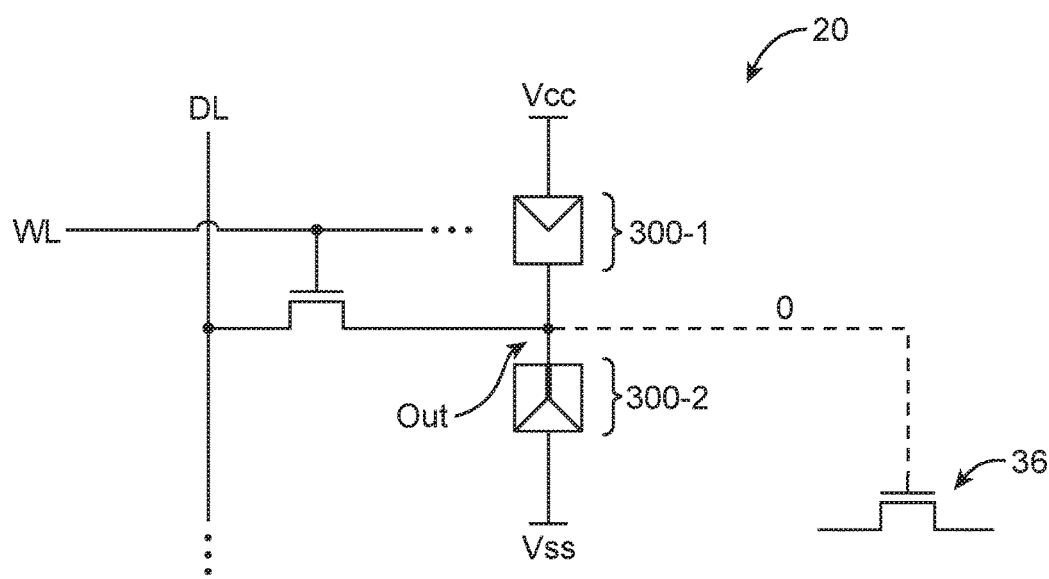

In accordance with an embodiment, integrated circuit 10 may include memory circuitry implemented using non-volatile memory elements (e.g., memory cells that retains its state regardless if device 10 is supplied with power). FIGS. 3A and 3B are diagrams of an illustrative back-to-back non-volatile resistive memory element 20 in accordance with an embodiment.

As shown in FIG. 3A, memory element 20 (sometimes referred to as a memory cell) may include a first non-volatile resistive element 300-1 and a second non-volatile resistive element 300-2 coupled in series between a positive power supply line 302 (e.g., a first power supply line on which positive power supply voltage Vcc is provided) and a ground power supply line 304 (e.g., a second power supply line on which ground power supply voltage Vss is provided). Power supply voltage Vcc may have a positive voltage level +V (e.g., 1 V, 1.2 V, 1.8 V, 2 V, etc.). Power supply voltage Vss may have a ground voltage level (e.g., 0 V).

In particular, resistive element 300-1 may have a first (anode) terminal that is connected to line 302 and a second (cathode) terminal that is connected to output node Out. Resistive element 300-2 may have a first (anode) terminal that is connected to line 304 and a second (cathode) terminal that is connected to node Out. In general, lines 302 and 304 may be provided with adjustable power supply voltages or may be in a high impedance mode. This arrangement in which the cathode of resistive element 300-1 is connected to and facing the cathode of resistive element 300-2 is sometimes referred to as a "back-to-back" configuration.

An address transistor such as transistor 306 may be coupled between data line DL and node Out. Transistor 306 may be activated using word line signal WL to load in a desired data value into memory cell 20. Transistor 306 is therefore sometimes referred to as a programming transistor or an access transistor.

The output node Out of memory cell 20 may be coupled to a corresponding pass transistor 36 via output path 38 (see also FIG. 2). Pass transistor 36 (sometimes referred to as a pass gate) may, as an example, be part of a routing multiplexer for routing active user signals from a first logic region to a second logic region on the integrated circuit, part of a programmable switch in a lookup table, or part of other configurable logic circuitry 18 on the integrated circuit.

Each resistive element 300 (e.g., resistive elements 300-1 and 300-2) may be a two-terminal electrochemical metallization memory device that relies on redox reactions to form (i.e., to "program") or to dissolve (i.e., to "erase") a conductive filament between the two terminals. The presence of a conductive filament between the two terminals produces a low resistance state (LRS), whereas the absence of the conductive filament between the two terminals produces a high resistance state (HRS). In LRS, the resistive element is sometimes referred to as being shorted or closed (i.e., activated, set, or programmed). In the HRS, the resistive element is sometimes referred to as being open or deactivated (i.e., switched out of use). Resistive element 300 configured in this way is sometimes referred to as a programmable metallization cell (PMC) or a conductive-bridging RAM (CBRAM). If desired, magnetic RAM cells might also be used. A complementary memory cell configured in this way may exhibit nonvolatile behavior, single event upset immunity, and very low standby current.

In the example of FIG. 3A, memory cell 20 may be set to a high state (e.g., resistive element 300-1 may be programmed in the low resistance state as indicated by the bolded internal connection, whereas resistive element 300-2 has been erased to the high resistance state as indicated by the absence of the internal connection). Configured in this way, node Out will be pulled up by positive power supply voltage Vcc through resistive element 300-1, thereby passing voltage level V+ to turn on corresponding pass transistor 36.

In the example of FIG. 3B, memory cell 20 may be set to a low state (e.g., resistive element 300-2 may be programmed in the low resistance state as indicated by the bolded internal connection, whereas resistive element 300-1 has been erased to the high resistance state as indicated by the absence of the internal connection). Configured in this way, node Out will be pulled down by ground power supply voltage Vss through resistive element 300-2, thereby passing zero volts to turn off corresponding pass transistor 36.

Figure 4:
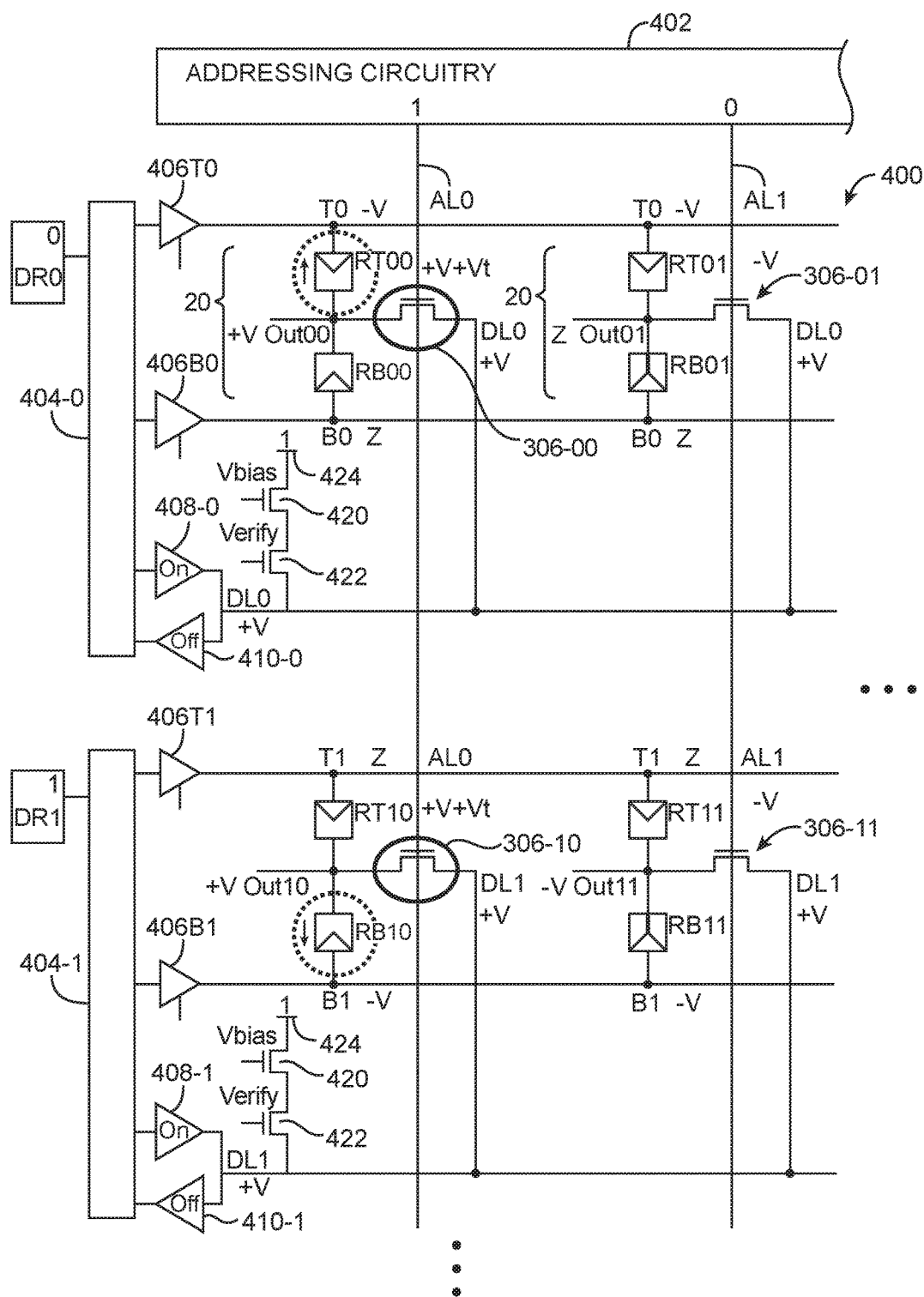
FIG. 4 is a circuit diagram illustrating a single-bit erase operation on a resistive memory array in accordance with an embodiment.

FIG. 4 is a circuit diagram illustrating a single-bit erase operation on a memory array 400 that includes memory cells 20 formed using complementary back-to-back resistive memory elements. As shown in FIG. 4, memory array 400 may be controlled by column addressing circuitry 402 and row driver circuitry 404. Addressing circuitry 402 (e.g., a shift register circuit or a decoder circuit) may output address signals to corresponding address transistors in each column of memory cells 20. In the example of FIG. 4, address circuitry 402 may output address signal AL0 to corresponding address transistors 306-00, 306-10, and other transistors in the first column and may also output address signal AL1 to corresponding address transistors 306-01, 306-11, and other transistors in the second column, etc. Address circuitry 402 may activate only one column at a time (e.g., at most one address signal may be asserted at any given point in time). The addressing circuitry enable logic "1" and disable logic "0" are equivalent to the +V or −V voltages defined in the biasing of FIG. 4 and FIG. 5.

Row driver circuitry 404 may be coupled to associated data register circuitry, power supply driver circuitry, and read-write circuitry. For example, row driver circuit 404-0 in the first row may receive data signals from a first data register DR0 and may drive the received data signal onto a first data line DL0 using data line driver 408-0. During a read operation, data line driver 408-0 may be deactivated while read driver 410-0 is turned on to sense a read voltage on data line DL0. Transistors 420 and 422 (e.g., n-channel transistors) may be coupled in series between power supply line 424 and data line DL0 to help read and/or monitor the performance of each memory cell 20. Transistor 420 may receive a bias control signal Vbias, whereas transistor 422 may receive a verify control signal Verify. Control signals Vbias and Verify may be global signals that are applied to every row in array 400 (as an example).

Row driver circuit 404-0 may also selectively provide power supply signals to the power supply terminals of each memory cell 20 in the first row via power supply drivers 406T0 and 406B0. In particular, power supply driver 406T0 may provide an adjustable power supply signal T0 to the "top" power supply terminal of each memory cell 20 in the first row, whereas power supply driver 406B0 may provide an adjustable power supply signal B0 to the "bottom" power supply terminal of each memory cell in the first row. Power supply drivers 406 may, for example, be tristate buffers. In an active mode, power supply drivers 406 may output signals T0 and B0 that are equal to positive voltage level +V or negative voltage level −V. In a tristate mode, the output of drivers 406 may be in a high impedance state (e.g., the output node may not be actively driven to any voltage level).

Similarly, row driver circuit 404-1 in the second row may receive data signals from a second data register DR1 and may drive the received data signal onto a second data line DL1 using data line driver 408-1. During a read operation, data line driver 408-1 may be deactivated while read driver 410-1 is turned on to sense a read voltage on data line DL1. Data line DL1 may also be coupled to its own set of transistors 420 and 422 for reading and/or monitoring the performance of each memory cell 20 in the second row.

Row driver circuit 404-1 may also selectively provide power supply signals to the power supply terminals of each memory cell 20 in the second row via power supply drivers 406T1 and 406B1 (e.g., tristate buffers 406). In particular, power supply driver 406T1 may provide an adjustable power supply signal T1 to the top power supply terminal of each memory cell 20 in the second row, whereas power supply driver 406B1 may provide an adjustable power supply signal B1 to the bottom power supply terminal of each memory cell in the second row.

There are only two rows and two columns of memory cells 20 in the illustrative array of FIG. 4, but in general there may be hundreds or thousands of rows and columns in memory array 400. Resistive memory element array 400 may be one of a number of arrays on a given device 10, may be a subarray that is part of a larger array, or may be any other suitable group of memory cells 20.

Referring still to FIG. 4, consider an example in which memory element 20 in the top left corner is initially configured in a high state (i.e., resistive element RT00 is in the LRS, and resistive element RB00 is in the HRS) and in which memory element 20 in the bottom left corner is initially configured in a low state (i.e., resistive element RB10 is in the LRS, and resistive element RT10 is in the HRS).

To perform a single-bit erase in the first row, driver 406T0 may drive signal T0 to negative voltage level −V while driver 406B0 is placed in a tristate mode such that signal B0 is electrically floating (as indicated by high impedance symbol "Z"). During this time, driver 408-0 may be activated to provide voltage level +V onto data line DL0. Address signal AL0 may be overdriven to voltage level (+V+Vt), where Vt represents the threshold voltage level for transistor 306-00. Overdriving address transistor 306-00 can help pull the corresponding output node Out00 all the way up to voltage level +V. By driving the cathode of resistive element RT00 to +V and the anode of resistive element RT00 to −V in this way, resistive element RT00 may be erased to HRS. Resistive element RB00 may remain unchanged as long as signal B0 is in the high impedance state.

To perform a single-bit erase in the second row, driver 406T1 may drive signal T1 to a tristate mode such that signal T1 is electrically floating (as indicated by high impedance symbol Z) while driving signal B1 to negative voltage level −V. During this time, driver 408-1 may be activated to provide voltage level +V onto data line DL1. Address signal AL0 may be overdriven to voltage level (+V+Vt), where Vt represents the threshold voltage level for transistor 306-10. Overdriving address transistor 306-10 can help pull the corresponding output node Out10 all the way up to voltage level +V. By driving the cathode of resistive element RB10 to +V and the anode of resistive element RB10 to −V in this way, resistive element RB10 may be erased to HRS. Resistive element RT10 may remain unchanged as long as signal T1 is in the high impedance state.

This single-bit erase operation can be performed in parallel for every memory cell 20 in one column, followed by erasure on a column-by-column basis (e.g., by successively asserting address signals AL0, AL1, etc.). Selectively tristating buffers 406 in the Z mode can also help provide zero voltage stress across all the unselected resistive elements (see, e.g., there is no voltage stress across resistive elements RB01 and RB11 in FIG. 4, so the unselected cells will not be disturbed).

Figure 5:
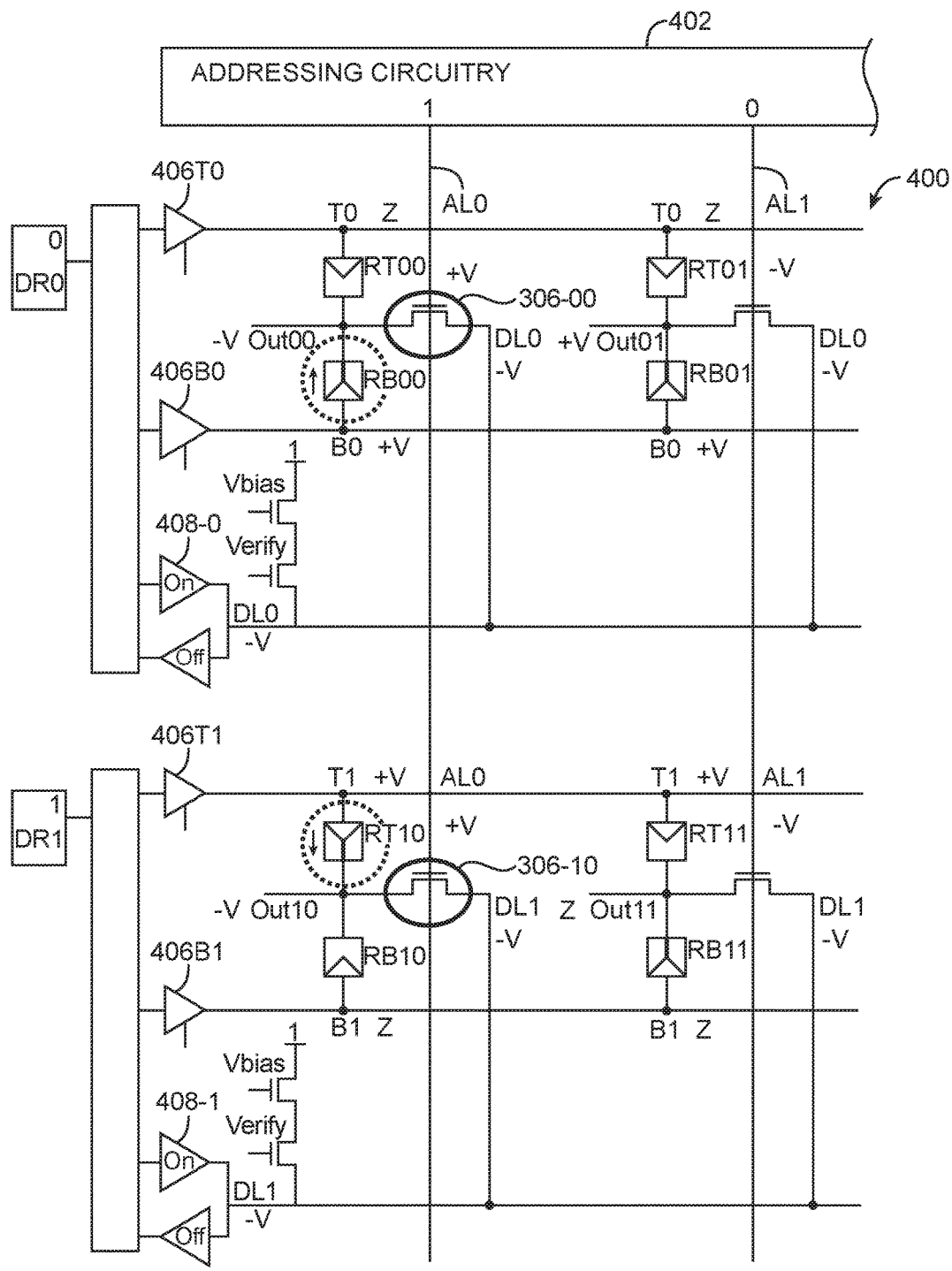
FIG. 5 is a circuit diagram illustrating a single-bit programming operation on a resistive memory array in accordance with an embodiment.

FIG. 5 is a circuit diagram illustrating a single-bit programming operation, on a previously erased bit, that can be performed on resistive memory array 400. To program the top left memory cell in the first row to store a logic "0" (as indicated by data signal "0" in data register DR0), driver 406T0 may be placed in the tristate mode such that signal T0 is in high impedance state Z while driver 406B0 may drive signal B0 to positive voltage level +V. During this time, driver 408-0 may be activated to provide negative voltage level −V onto data line DL0. Address signal AL0 may be asserted to voltage level +V. Address signal AL0 need not be overdriven in this case since transistor 306-00 is passing a low voltage. By driving the cathode of resistive element RB00 to −V and the anode of resistive element RB00 to +V in this way, resistive element RB00 may be programmed to LRS. Resistive element RT00 may remain unchanged as long as signal T0 is in the high impedance state.

To program the bottom left memory cell in the first row to store a logic "1" (as indicated by data signal "1" in data register DR1), driver 406B1 may be placed in the tristate mode such that signal B1 is in high impedance state Z while driver 406T1 may drive signal T1 to positive voltage level +V. During this time, driver 408-1 may be activated to provide negative voltage level −V onto data line DL1 while address signal AL0 is asserted to voltage level +V. By driving the cathode of resistive element RT10 to −V and the anode of resistive element RT10 to +V in this way, resistive element RT10 may be programmed to LRS. Resistive element RB10 may remain unchanged as long as signal B1 is in the high impedance state.

The single-bit programming operation can be performed in parallel for each memory cell 20, in one column, followed by programming on a column-by-column basis (e.g., by successively asserting address signals AL0, AL1, etc.). Configured in this way, most of associated memory circuits (e.g., address transistors 306, addressing circuitry 402, row driver circuitry 404, the data registers, power supply drivers 406, read/write circuits 408 and 410, transistors 420 and 422, etc.) are subject to a voltage stress of at most +V. Voltage level +V may be equal to positive power supply voltage Vcc. For example, positive power supply voltage Vcc may have a voltage level +V that is equal to 1 V.

As shown in the example of FIG. 5, a programming operation may require a total voltage of 2*(+V) across a resistive element 300. For example, an erase operation may require at least 2*(−V) across the anode and cathode terminals. On the other hand, a programming operation may require at least 2*(+V) across the anode and cathode terminals. Only address transistor 306 may be exposed to a total voltage stress of 2*(+V), since during programming, it receives +V (e.g., 1 V) at its gate and −V (e.g., −1 V) from the data line (see FIG. 5). In other words, the magnitude of the negative voltage level −V and the magnitude of the positive voltage level +V may be equal. This may be tolerable for up to a predetermined number of program cycles (e.g., at least 3000 configuration cycles) for reliability concerns. In yet other suitable embodiments, the programming voltage may be at least 1.5*Vcc, at least 1.8*Vcc, or more than 2*Vcc.

By splitting the programming voltage between the positive rail (+V) and the negative rail (−V) on either side of the resistive memory element, all of the associated memory circuits may be implemented using core transistor devices (e.g., transistors having the thinnest gate oxide thickness allowed by the current fabrication design rules). Typically, input-output circuits (e.g., I/O circuits 12 of FIG. 1) are formed using input-output transistor devices having relatively thicker gate oxides compared to the core transistor devices so that the I/O transistors are able to withstand higher voltage stress (i.e., thicker gate oxides exhibit greater junction breakdown voltage levels). Using primarily core transistors within memory array 400 may help reduce memory die area while improving or at least maintaining reliability.

Figure 6:
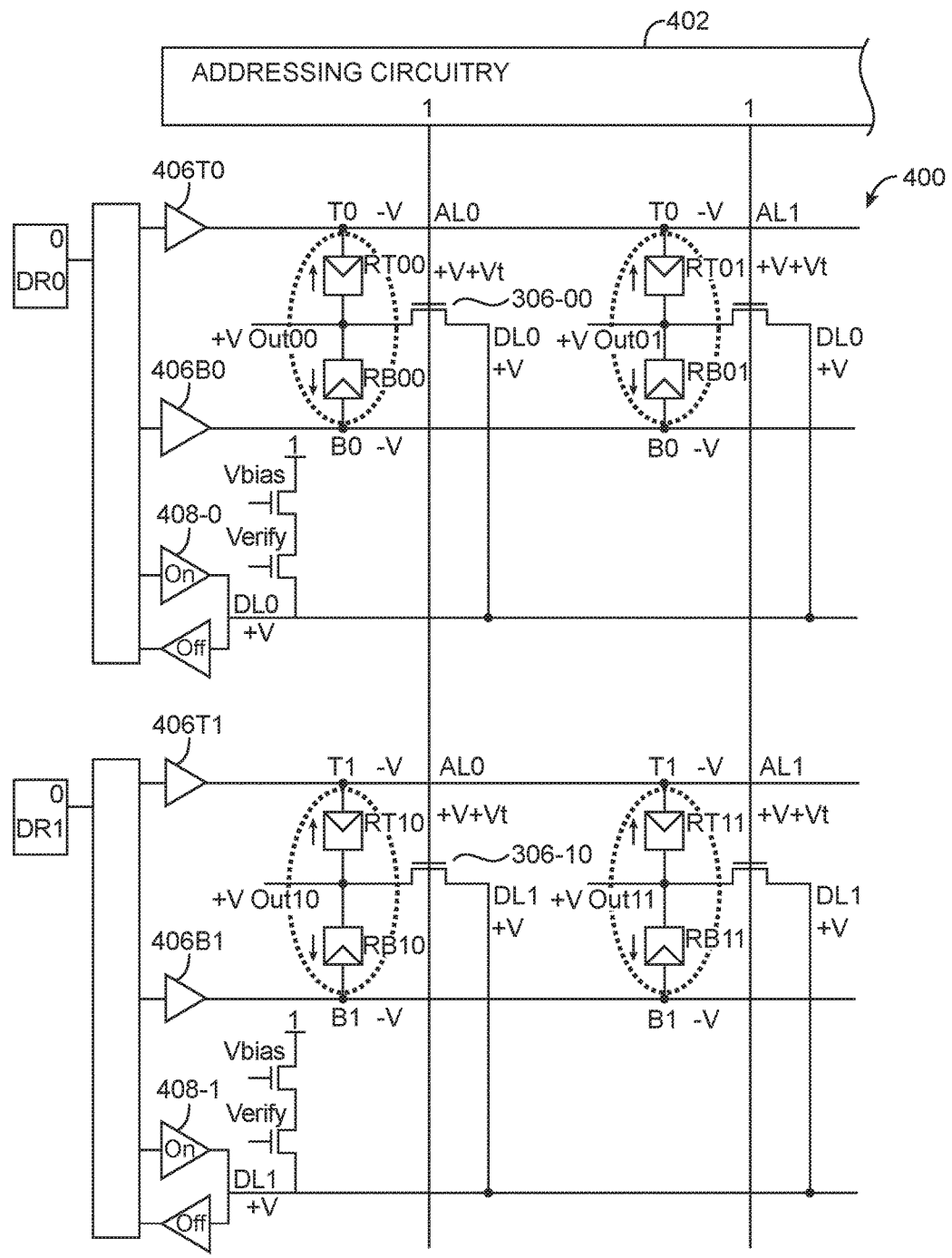
FIG. 6 is a circuit diagram illustrating a global erase operation on a resistive memory array in accordance with an embodiment.

FIG. 6 is a circuit diagram illustrating a global erase operation that can be performed on resistive memory array 400. As shown in FIG. 6, all of power supply drivers 406 may output negative voltage level −V onto the anode terminals of each resistive element. Meanwhile, driver 408 in each row may drive all of the data lines to positive voltage level +V through the overdriven address transistors 306 (e.g., all address transistors may be simultaneously activated) so that the cathode terminal of each resistive element receives +V. Operated in this way, every single resistive element in memory array 400 may be erased to the HRS in parallel (e.g., the entire resistive memory array can be simultaneously reset in a single write cycle). Address transistors 306 may have to be double in width to allow simultaneous top and bottom resistive element reset.

Figure 7:
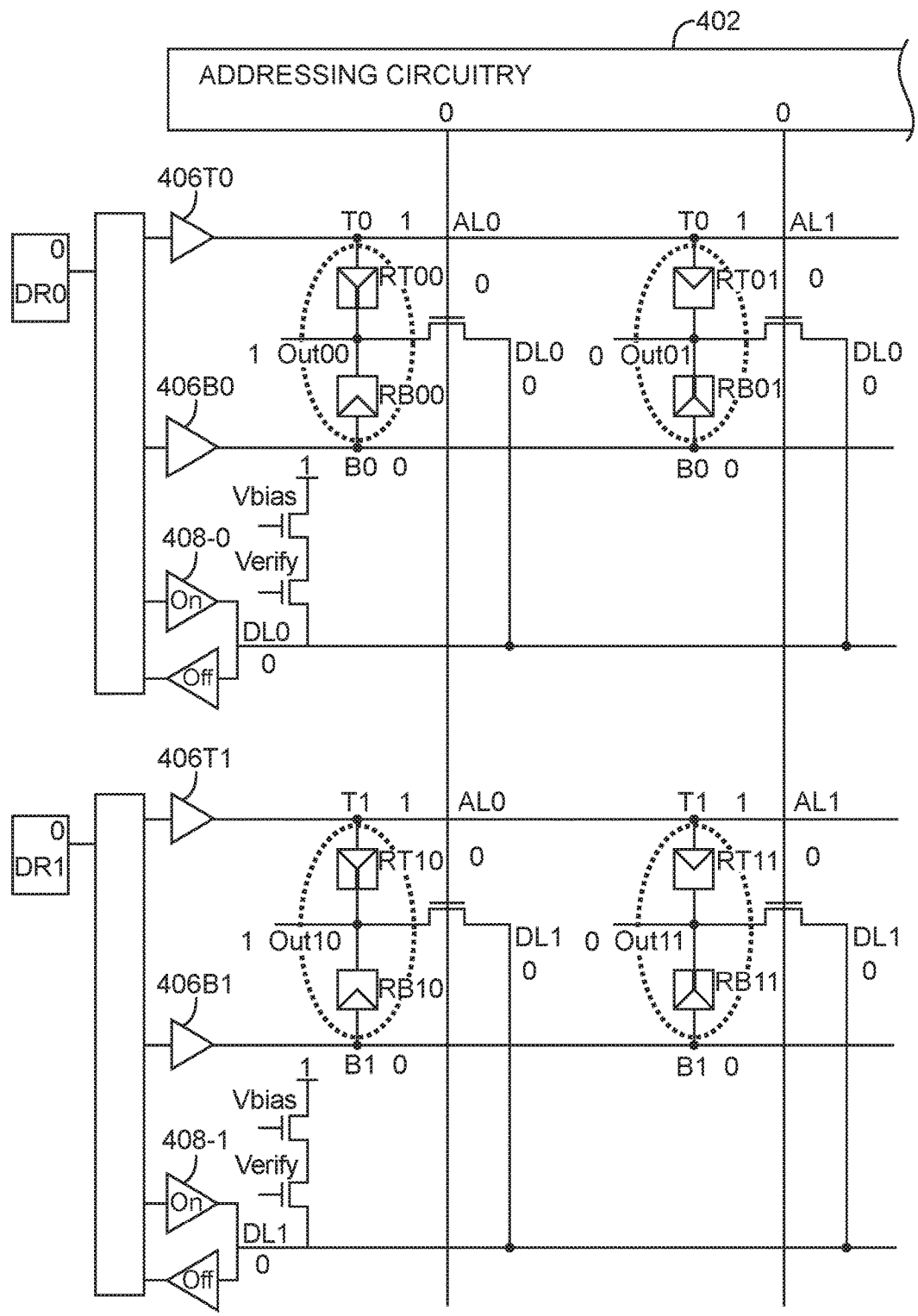
FIG. 7 is a circuit diagram illustrating a normal hold operation for a resistive memory array in accordance with an embodiment.

FIG. 7 is a circuit diagram illustrating a normal hold operation for resistive memory array 400. As shown in FIG. 7, the top power supply drivers (e.g., drivers 406T0, 406T1, etc.) may drive the top power supply voltage signals to logic "1" (e.g., to Vcc or +V). Meanwhile, the bottom power supply drivers (e.g., drivers 406B0, 406B1, etc.) may drive the bottom power supply voltage signals to logic "0" (e.g., to Vss or 0 V). All address signals may be deasserted so the state of the data lines will not affect the output nodes of each memory cell 20.

In the example of FIG. 7, the top left memory cell 20 may be programmed in the high state (e.g., node Out00 may output a logic "1" to a first corresponding pass gate—not shown). The top right memory cell 20 may be programmed in the low state (e.g., node Out01 may output a logic "0" to a second corresponding pass gate—not shown). The bottom left memory cell 20 may be programmed in the high state (e.g., node Out10 may output a logic "1" to a third corresponding pass gate—not shown). The bottom right memory cell 20 may be programmed in the low state (e.g., node Out11 may output a logic "0" to a fourth corresponding pass gate—not shown). Memory array 400 configured in this way may exhibit nonvolatile behavior, soft error upset immunity, and very low standby current.

Figure 8:
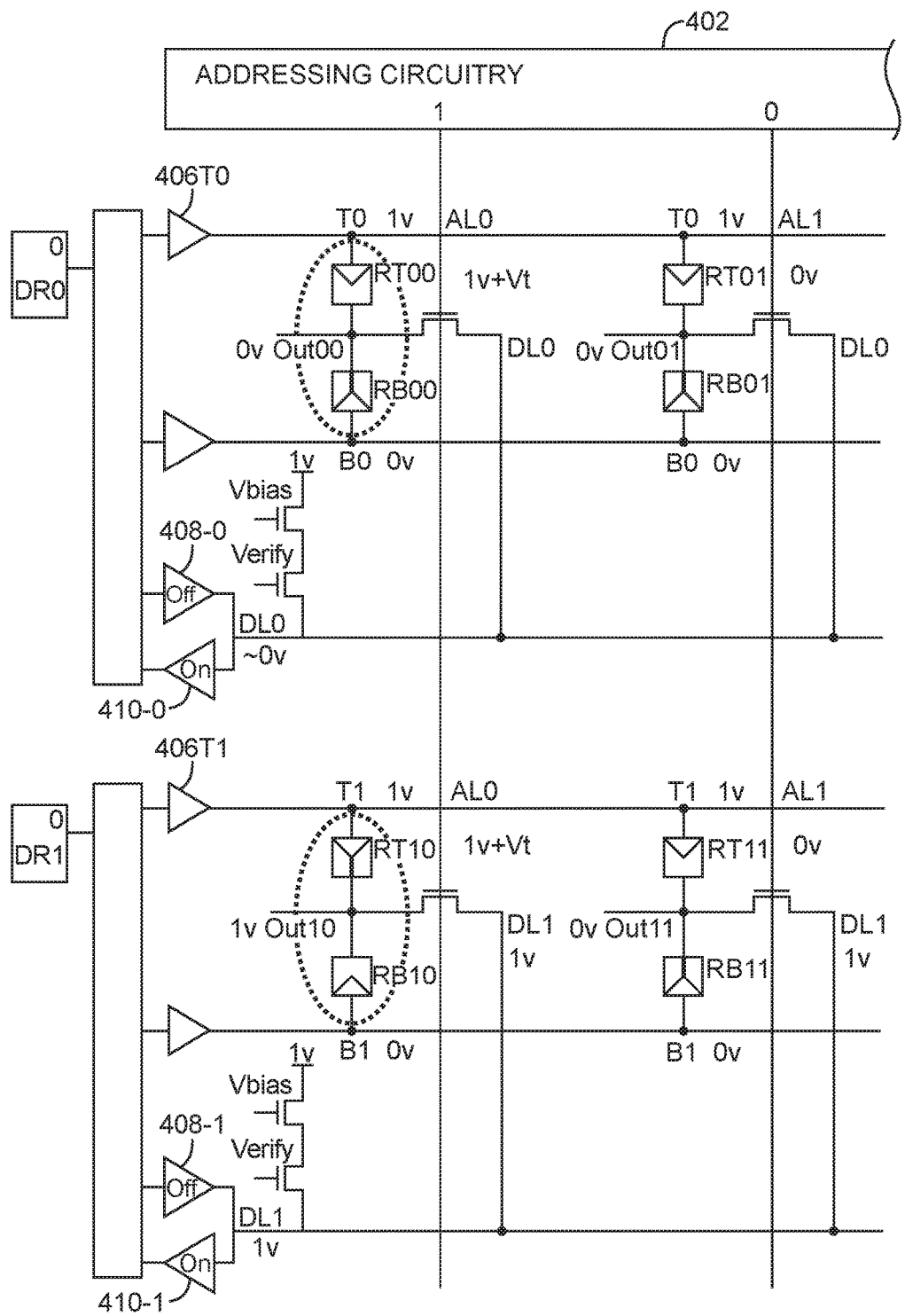
FIG. 8 is a circuit diagram illustrating a read operation on a resistive memory array in accordance with an embodiment.

FIG. 8 is a circuit diagram illustrating a read operation on resistive memory array 400. Similar to the normal mode of FIG. 7, the top power supply drivers (e.g., drivers 406T0, 406T1, etc.) may drive the top power supply voltage signals to logic "1" (e.g., to Vcc or +V). Meanwhile, the bottom power supply drivers (e.g., drivers 406B0, 406B1, etc.) may drive the bottom power supply voltage signals to logic "0" (e.g., to Vss or 0 V).

In the instance of FIG. 8, addressing circuitry 402 may overdrive signal AL0 to turn on the address transistors in the first column. The top left memory cell 200 is currently storing a logic zero, whereas the bottom left memory cell 200 is currently storing a logic one. As a result, data line DL0 may be pulled low by node Out00, whereas data line DL1 may be pulled high by node Out10. Driver 410-0 may be activated to sense the low voltage on data line DL0, whereas driver 410-1 may be activated to sense the high voltage on data line DL1-1, and the drivers 408-0 and 408-1 need to be tri-stated. During this time, signals Vbias and Verify may also be asserted (e.g., driven high) to serve as a weak keeper circuit for the data line. Operated in this way, resistive elements RB00 and RB10 are read out from the first and second rows, respectively, to determine whether the correct set and reset resistances have been achieved for both memory cells 20.

Moreover, this verification operation can be performed with or without a precharge operation. The precharge operation precharges the data line prior to asserting the address signal, which can help increase read speed and consistency.

Figure 9A:
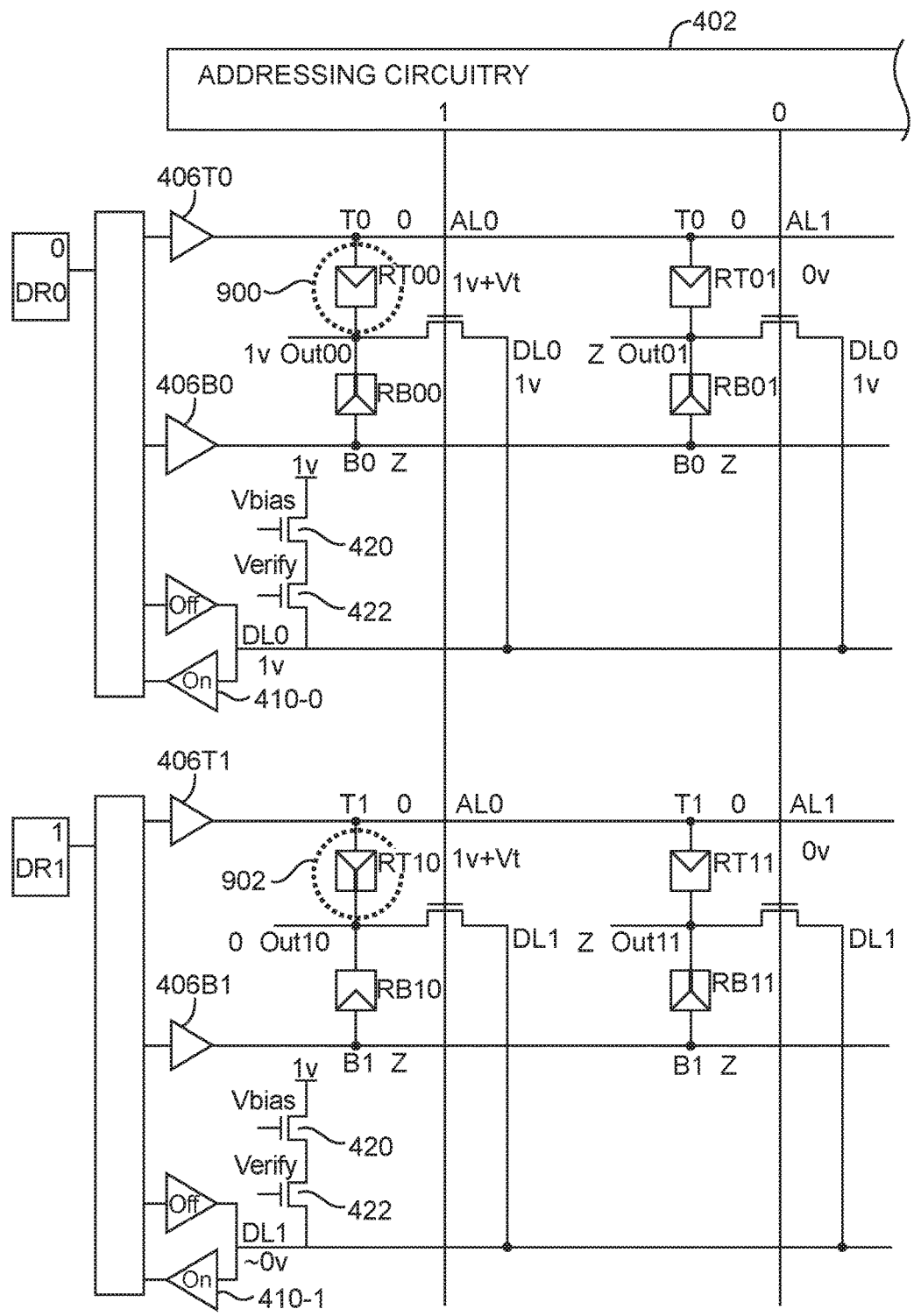
FIG. 9A is a circuit diagram illustrating a top-bit margin testing operation on a resistive memory array in accordance with an embodiment.
Figure 9B:
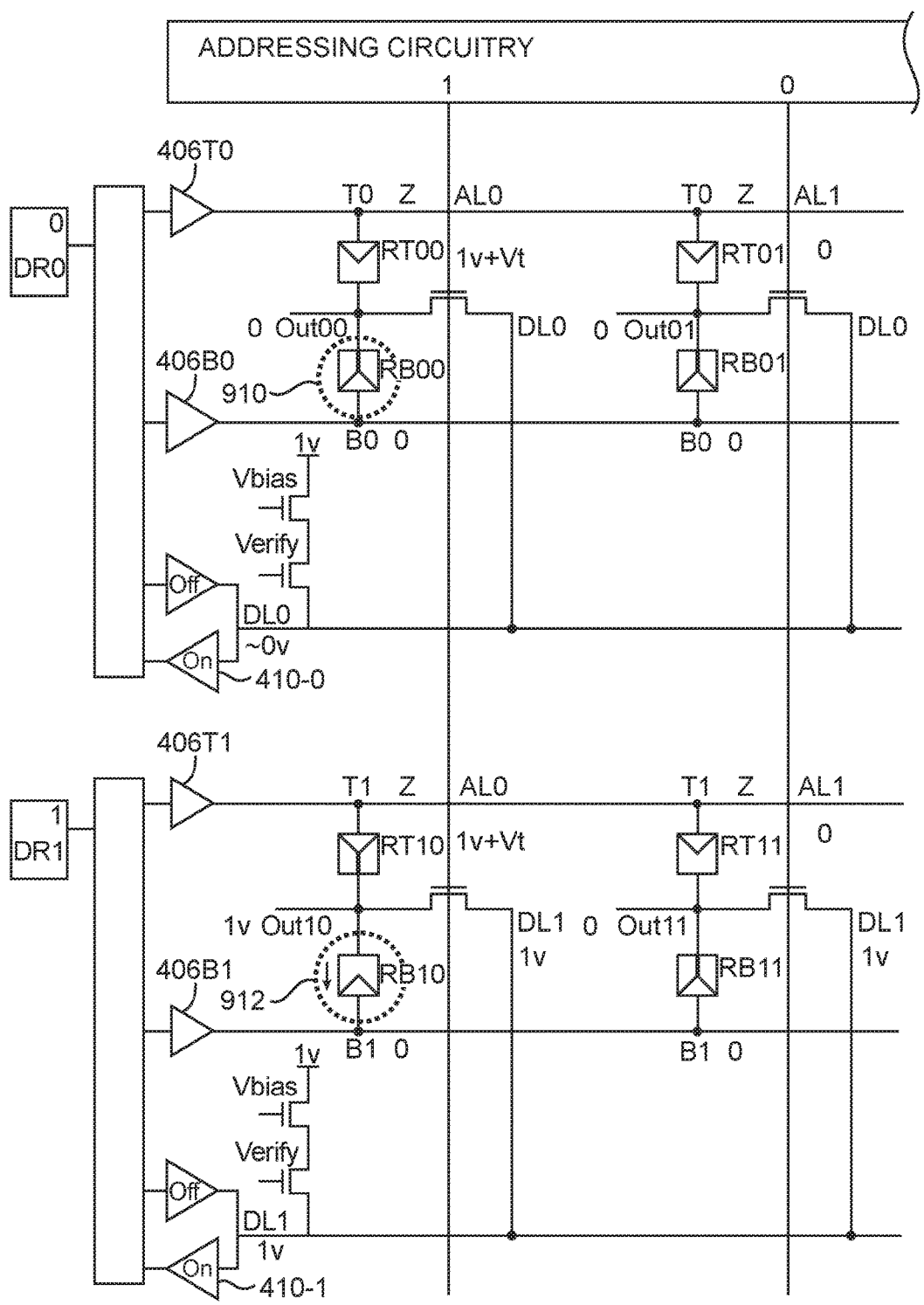
FIG. 9B is a circuit diagram illustrating a bottom-bit margin testing operation on a resistive memory array in accordance with an embodiment.
Figure 9C:
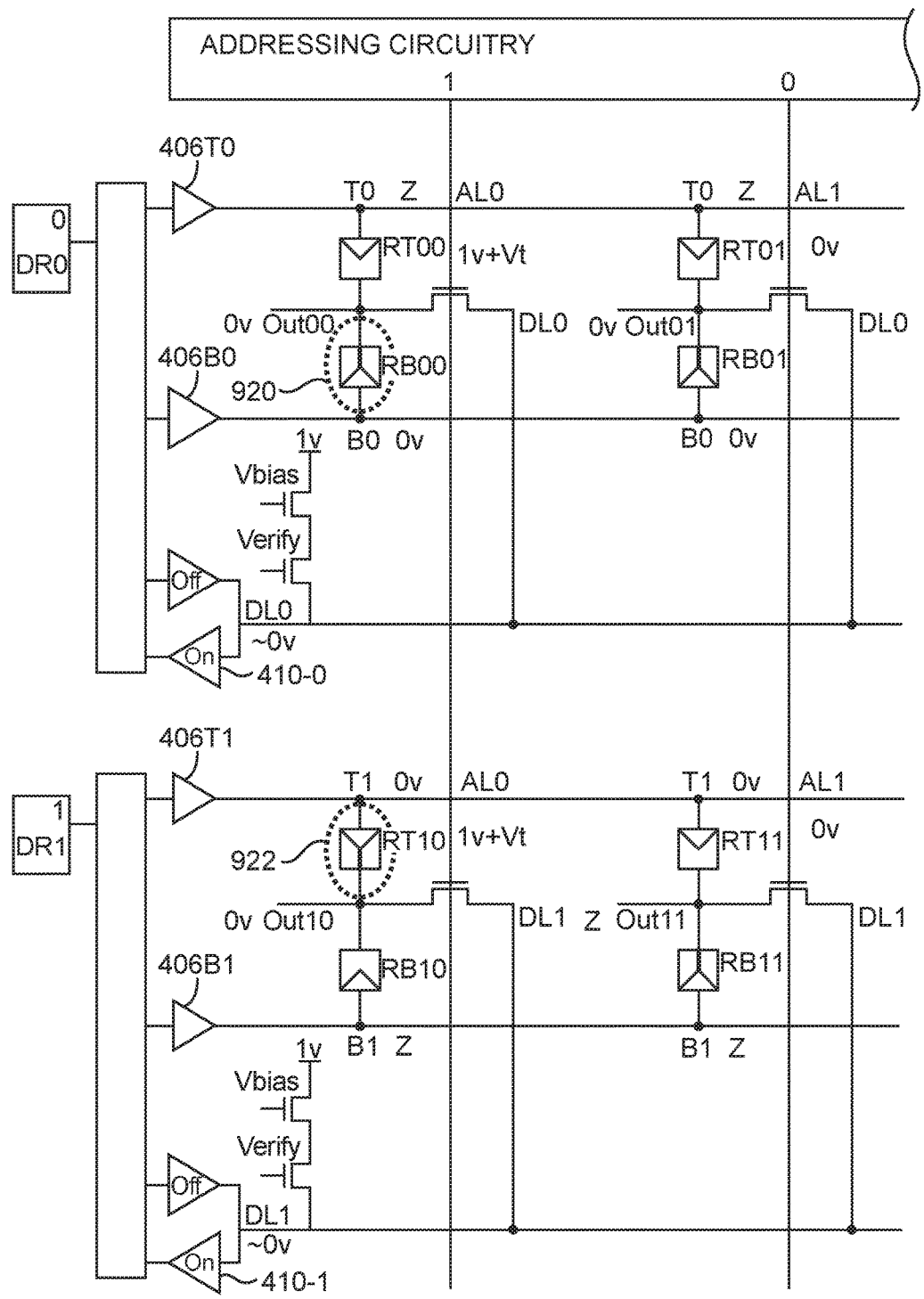
FIG. 9C is a circuit diagram illustrating a set-bit margin testing operation on a resistive memory array in accordance with an embodiment.

FIGS. 9A-9C show how individual resistive elements can be margin tested to determine whether the correct set resistance has been achieved. FIG. 9A shows how to margin the top resistive element of each memory cell 20, as indicated by regions of interest 900 and 902. To perform top-bit margining, the top power supply drivers (e.g., driver 406T0, 406T1, etc.) may output 0 V while the bottom power supply drivers (e.g., driver 406B0, 406B1, etc.) may be placed in tristate mode. Signals Vbias and Verify may be asserted during margining operations. Signal AL0 may be asserted to access the first column.

Since the top bit RT00 in the first row is in HRS and since signal B0 is in high impedance mode, transistors 420 and 422 may pull data line DL0 and node Out00 high to 1 V. However, the top bit RT10 in the second row is in LRS, which will pull node Out10 and therefore data line DL1 down towards 0 V. Data line DL1 will pull down to logic "0" against the pull-up strength of transistors 420 and 422 so long as the set resistance of element RT10 is adequately low. If the set resistance of element RT10 is sufficiently low, read circuit 410-1 will sense a low voltage at data line DL1. Successive columns of memory cells 20 may be tested in this way.

FIG. 9B shows how to margin the bottom resistive element of each memory cell 20, as indicated by regions of interest 910 and 912. To perform bottom-bit margining, the top power supply drivers (e.g., driver 406T0, 406T1, etc.) may be placed in tristate mode while the bottom power supply drivers (e.g., driver 406B0, 406B1, etc.) may output 0 V. Signals Vbias and Verify may be asserted during margining operations. Signal AL0 may be asserted to access the first column.

Since the bottom bit RB10 in the second row is in HRS and since signal T1 is in high impedance mode, transistors 420 and 422 may pull data line DL1 and node Out10 high to 1 V. However, the bottom bit RB00 in the first row is in LRS, which will pull node Out00 and therefore data line DL0 down towards 0 V. Data line DL0 will pull down to logic "0" against the pull-up strength of transistors 420 and 422 so long as the set resistance of element RB00 is adequately low. If the set resistance of element RB00 is sufficiently low, read circuit 410-0 will sense a low voltage at data line DL0. Successive columns of memory cells 20 may be tested in this way.

FIG. 9C shows how to margin the programmed resistive element of each memory cell 20, as indicated by regions of interest 920 and 922. Since only the bottom bit RB00 is programmed in the top left memory cell 20, a bottom-bit margining configuration will be applied to that cell (e.g., by driving signal B0 to 0 V and signal T0 to high impedance Z). If the set resistance of element RB00 is sufficiently low, read circuit 410-0 will sense a low voltage at data line DL0. On the other hand, since only the top bit RT10 is programmed in the bottom left memory cell 20, a top-bit margining configuration will be applied to that cell (e.g., by driving signal T1 to 0 V and signal B1 to high impedance Z). If the set resistance of element RT10 is sufficiently low, read circuit 410-1 will sense a low voltage at data line DL1. Successive columns of memory cells 20 may be tested in this way.

The step of margining the resistances of the non-volatile resistive elements against quantized levels of current flowing through transistors 420 and 422 can help further increase reliability.

Figure 10:
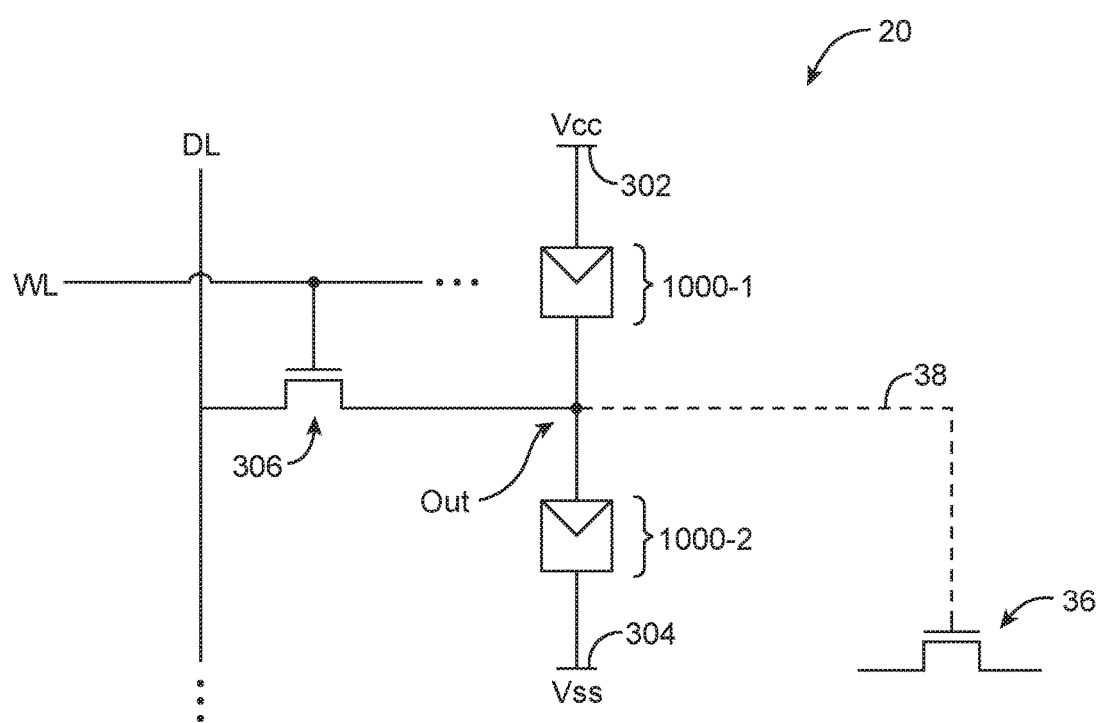
FIG. 10 is a diagram of an illustrative inline non-volatile resistive memory element in accordance with an embodiment.

The embodiments of FIGS. 3-9 implementing memory cells using complementary back-to-back resistive elements is merely illustrative. In another suitable arrangement, memory cell 20 may be implemented using resistive elements connected in an "in-line" configuration (see, e.g., FIG. 10). As shown in FIG. 10, memory cell 20 may include a first non-volatile resistive element 1000-1 and a second non-volatile resistive element 1000-2 coupled in series between power supply lines 302 and 304. Power supply voltage Vcc on line 302 may have a positive voltage level +V (e.g., 1 V, 1.2 V, 1.8 V, 2 V, etc.). Power supply voltage Vss on line 304 may have a ground voltage level (e.g., 0 V).

In particular, resistive element 1000-1 may have a first (anode) terminal that is connected to line 302 and a second (cathode) terminal that is connected to output node Out. Resistive element 1000-2 may have a first (anode) terminal that is connected to node Out and a second (cathode) terminal that is connected to line 304. This arrangement in which the cathode of resistive element 1000-1 is connected to and facing the anode of resistive element 1000-2 is sometimes referred to as an "in-line" configuration. The back-to-back configuration may offer smaller cell layout compared to the in-line configuration since the cathode terminals are shared between the top and bottom resistive elements. In general, lines 302 and 304 may be provided with adjustable power supply voltages or may be in a high impedance mode.

An address transistor such as transistor 306 may be coupled between data line DL and node Out. Transistor 306 may be activated using word line signal WL to load in a desired data value into memory cell 20. Transistor 306 is therefore sometimes referred to as a programming transistor or an access transistor.

The output node Out of memory cell 20 may be coupled to a corresponding pass transistor 36 via output path 38 (see also FIG. 2). Pass transistor 36 (sometimes referred to as a pass gate) may, as an example, be part of a routing multiplexer for routing active user signals from a first logic region to a second logic region on the integrated circuit, part of a programmable switch in a lookup table, or part of other configurable logic circuitry 18 on the integrated circuit.

Each resistive element 1000 (e.g., resistive elements 1000-1 and 1000-2) may be a programmable metallization cell (PMC) or a conductive-bridging RAM (CBRAM) that can be configured either in a low resistance state (LRS) or a high resistance state (HRS). A complementary memory cell configured in this way may exhibit nonvolatile behavior, soft error upset immunity, and zero standby current.

In the example of FIG. 10, either resistive element 1000-1 may be set in LRS, while element 1000-2 is in HRS, so that cell 20 is configured to store a logic "1" or resistive element 1000-2 may be set in LRS, while element 1000-1 is in HRS, so that cell 20 is configured to store a logic "0".

In general, in-line non-volatile memory cell 20 of the type shown in FIG. 10 may be arranged in an array and each memory cell 20 may be programmed, erased, and tested using similar principles and techniques described above in connection with FIGS. 4-9.

Figure 11:
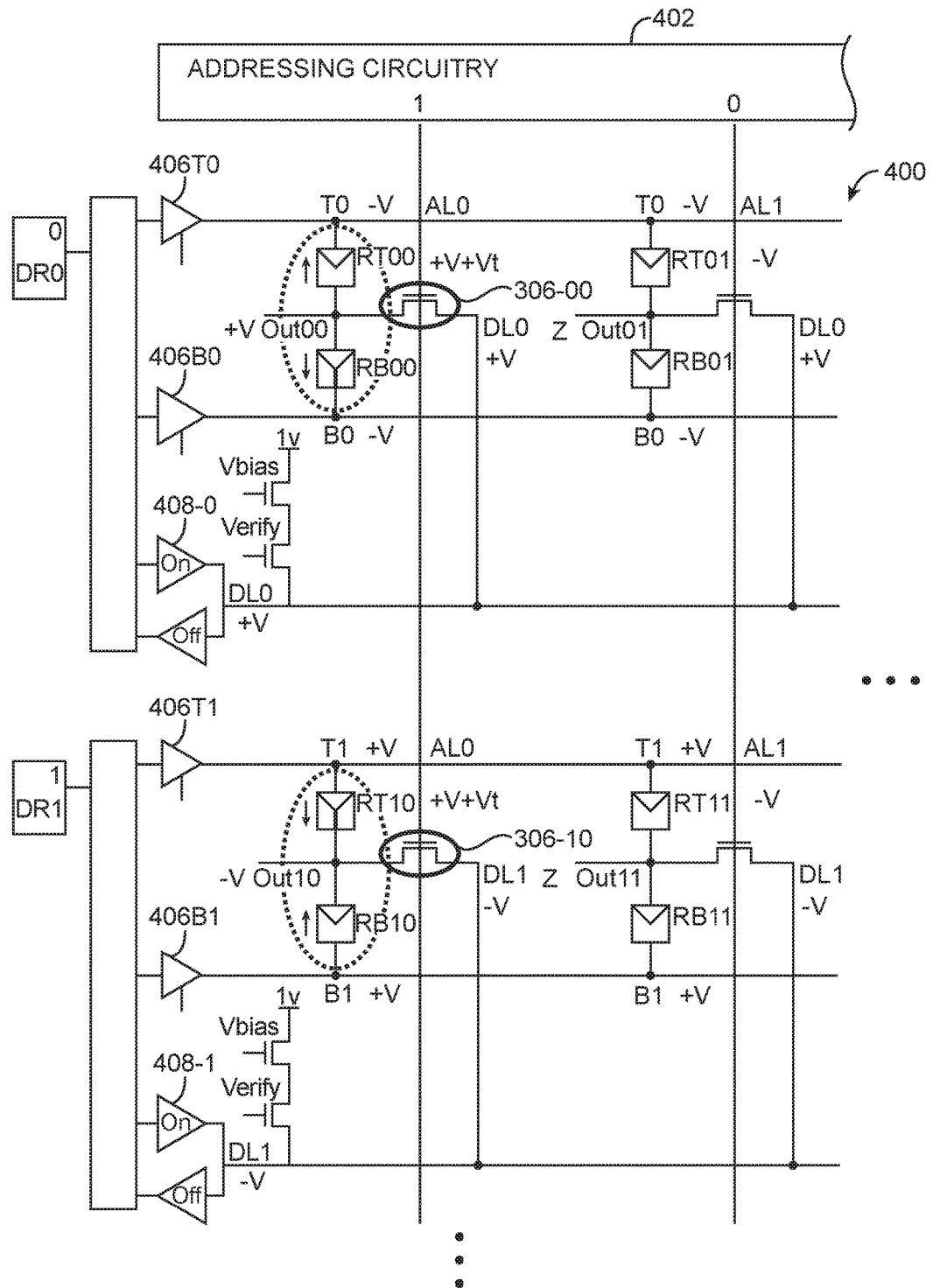
FIG. 11 is a circuit diagram illustrating a combined program-erase operation on a resistive memory array in accordance with an embodiment.

One advantage of in-line memory arrays is that all cells 20 along a column can be simultaneously set (programmed) and reset (erased). FIG. 11 is a circuit diagram illustrating a combined program-erase operation on resistive memory array 400. To configure memory cell 20 to store a logic "0" (as shown in the top left memory cell in the first row), the top and bottom tristate power supply buffers 406T0 and 406B0 may output negative voltage level −V while write driver 408-0 outputs positive voltage level +V. Meanwhile, addressing circuitry 402 may overdrive transistor 306-00, thereby driving node Out00 to positive voltage level +V. Operated in this way, resistive element RT00 will be erased while resistive element RB00 will be programmed in parallel.

To configured memory cell 20 to store a logic "1" (as shown in the bottom left memory cell in the second row), the top and bottom tristate power supply buffers 406T1 and 406B1 may output positive voltage level +V while write driver 408-1 outputs negative voltage level −V. Meanwhile, addressing circuitry 402 may overdrive transistor 306-10, thereby driving node Out10 to negative voltage level −V. Operated in this way, resistive element RT10 will be programmed while resistive element RT10 will be erased simultaneously. Successive columns of memory cells 20 may be simultaneously programmed and erased in this way. Therefore, a two-step process involving a global reset followed by a separate programming operation can be simplified into a single operation.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art. The foregoing embodiments may be implemented individually or in any combination.

What is claimed is:

1. An integrated circuit comprising:
   a first power supply terminal that receives a first adjustable power supply voltage;
   a second power supply terminal that receives a second adjustable power supply voltage;
   a first non-volatile resistive element that comprises:
      a first anode terminal coupled to the first power supply terminal; and
      a first cathode terminal; and
   a second non-volatile resistive element that comprises:
      a second anode terminal coupled to the second power supply terminal; and
      a second cathode terminal coupled to the first cathode terminal of the first non-volatile resistive element, wherein the first non-volatile resistive element and the second non-volatile resistive element form a conductive-bridging random-access memory cell.

2. The integrated circuit of claim 1, further comprising:
   a first tristate buffer that drives the first power supply terminal; and
   a second tristate buffer that drives the second power supply terminal.

3. The integrated circuit of claim 1, wherein the first adjustable power supply voltage is negative.

4. The integrated circuit of claim 1, wherein the second adjustable power supply voltage is negative.

5. An integrated circuit comprising:
   a first power supply terminal that receives a first adjustable power supply voltage;
   a second power supply terminal that receives a second adjustable power supply voltage;
   a first non-volatile resistive element that comprises:
      a first anode terminal coupled to the first power supply terminal; and
      a first cathode terminal; and
   a second non-volatile resistive element that comprises:
      a second anode terminal coupled to the second power supply terminal;
      a second cathode terminal coupled to the first cathode terminal of the first non-volatile resistive element;
   a data line;
   an address transistor coupled between the data line and the first cathode terminal;
   an additional power supply line;
   a first transistor coupled between the additional power supply line and the data line, the first transistor receives a bias control voltage; and
   a second transistor coupled in series with the first transistor between the additional power supply line and the data line, the second transistor receives a verification control voltage.

6. The integrated circuit of claim 1, further comprising:
   a pass transistor having a gate terminal that receives a static control signal from the first cathode terminal.

7. The integrated circuit of claim 1, further comprising:
   input-output circuitry having a first gate oxide thickness; and
   an address transistor coupled to the first cathode terminal, the address transistor having a second gate oxide thickness that is less than the first gate oxide thickness.

8. A method of operating an integrated circuit, the method comprising:
   driving a data line to a negative voltage level, wherein the integrated circuit includes a first non-volatile resistive element and a second non-volatile resistive element coupled in series between a first power supply line and a second power supply line, and wherein the first and second non-volatile resistive elements are coupled to the data line; and
   programming the first non-volatile resistive element by driving the first power supply line to a positive voltage level while a cathode terminal of the first non-volatile resistive element receives the negative voltage level.

9. The method of claim 8, wherein the magnitude of the negative voltage level and the magnitude of the positive voltage level are equal.

10. The method of claim 8, further comprising:
    erasing the second non-volatile resistive element by driving the data line to the positive voltage level while driving the second power supply line to the negative voltage level.

11. The method of claim 8, wherein the first non-volatile resistive element has a first cathode terminal, and wherein the second non-volatile resistive element has a second cathode terminal that faces the first cathode terminal.

12. The method of claim 8, further comprising configuring the second power supply line in a high impedance state.

13. The method of claim 8, further comprising:
    during a global erase operation, driving both the first and second power supply lines to the negative voltage level while driving the data line to the positive voltage level.

14. The method of claim 8, further comprising:
    determining whether the resistance of the second non-volatile resistive element is sufficiently low.

* * * * *